(12) United States Patent
Kaczynski et al.

(10) Patent No.: US 7,051,063 B2
(45) Date of Patent: May 23, 2006

(54) INTEGRATED LOW POWER CHANNEL SELECT FILTER HAVING HIGH DYNAMIC RANGE AND BANDWIDTH

(75) Inventors: Brian Kaczynski, Los Altos, CA (US); Srenik Mehta, Pleasanton, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 672 days.

(21) Appl. No.: 10/138,848

(22) Filed: May 3, 2002

(65) Prior Publication Data

US 2003/0207679 A1     Nov. 6, 2003

(51) Int. Cl.
*G06G 7/02*     (2006.01)
(52) U.S. Cl. .......................................... 708/819; 708/5
(58) Field of Classification Search ............... 708/819, 708/5
See application file for complete search history.

(56) References Cited

U.S. PATENT DOCUMENTS

| | | | | |
|---|---|---|---|---|
| 5,072,298 | A * | 12/1991 | Sumiyoshi | 348/711 |
| 5,245,565 | A * | 9/1993 | Petersen et al. | 708/819 |
| 5,325,317 | A * | 6/1994 | Petersen et al. | 708/300 |
| 5,463,349 | A * | 10/1995 | Petersen et al. | 330/254 |
| 6,097,244 | A | 8/2000 | Chen | |
| 6,417,737 | B1 * | 7/2002 | Moloudi et al. | 330/301 |
| 6,738,601 | B1 * | 5/2004 | Rofougaran et al. | 455/66.1 |
| 2002/0011896 | A1* | 1/2002 | Yokoyama et al. | 327/552 |
| 2003/0067359 | A1* | 4/2003 | Darabi et al. | 331/46 |

OTHER PUBLICATIONS

Gopinathan, V. (1990) "Design Considerations for Integrated Continuous-Time Video Filters," *IEEE Journal of Solid State Circuits*, pp. 1177-1180.

Changsik Yoo et al. (1997) "A 15 MHz, 2.6 mW, Sixth-Order Bandpass Gm-C Filter in CMOS," *Proceedings of the 40th Midwest Symposium on Circuits and Systems*, pp. 316-319.

Baschirotto, A. et al. (2000) "High-Frequency CMOS Low-Power Single-Branch Continuous-Time Filters," *Proc. Circuits and Systems, Geneva*.

Gopinathan, V. et al. (1990) "Design Considerations for High-Frequency Continuous-Time Filters and Implementation of an Antialiasing Filter for Digital Video," *IEEE Journal of Solid-State Circuits*, 25(6):1368-1378.

Durham, A. et al. (1992) "High-Linearity Continuous-Time Filter in 5-V VLSI CMOS," *IEEE Journal of Solid-State Circuits*, 27(9):1270-1276.

* cited by examiner

*Primary Examiner*—Tan V. Mai
(74) *Attorney, Agent, or Firm*—Bever, Hoffman & Harms, LLP; Jeanette S. Harms

(57) ABSTRACT

A channel select filter circuit is disclosed using a current-mode transconductance-capacitor (gm-C) architecture, which is tuned by digitally controlled capacitor arrays. The main filter includes at least one transconductor-capacitor (gm-C) filter and a transresistance amplifier. A replica transconductor-capacitor (gm-C) filter and a phase detector are used to establish any phase shift in an input signal, and a state machine adjusts capacitor arrays in the the replica transconductor-capacitor (gm-C) filter and the at least one transconductor-capacitor (gm-C) filter in order to set a cut-off frequency of the channel select filter.

24 Claims, 8 Drawing Sheets

Channel Select Filter Block Diagram

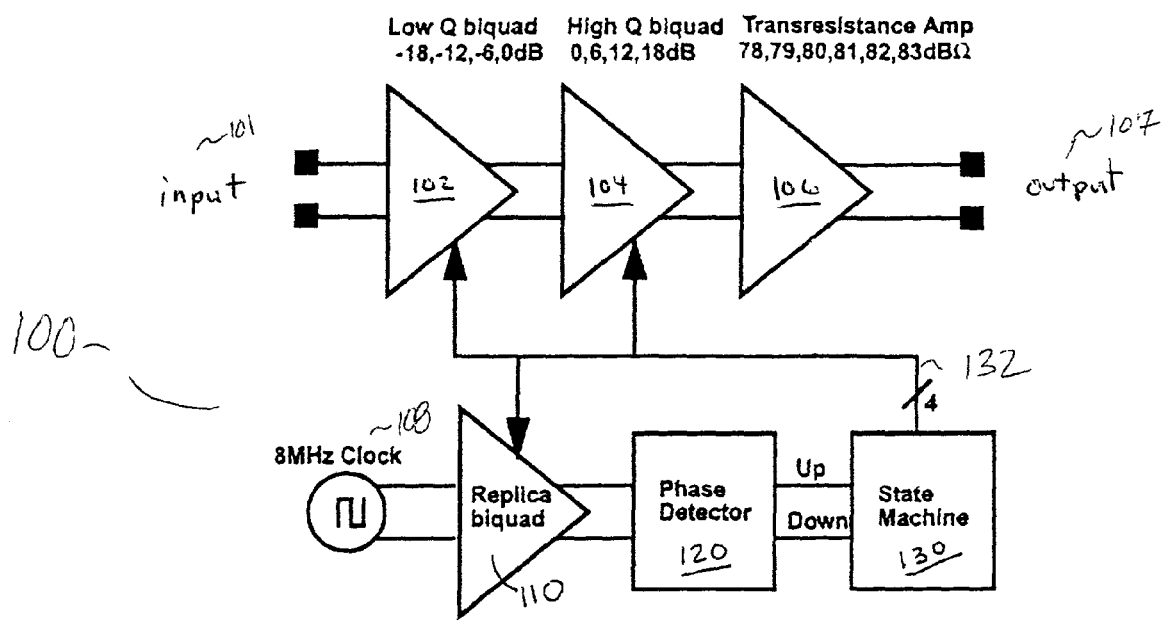
FIGURE 1. Channel Select Filter Block Diagram

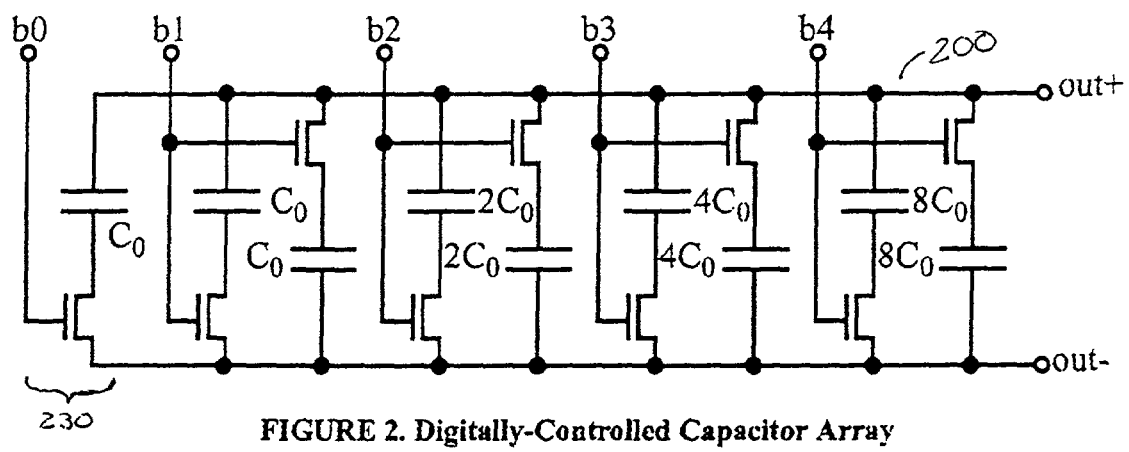
FIGURE 2. Digitally-Controlled Capacitor Array

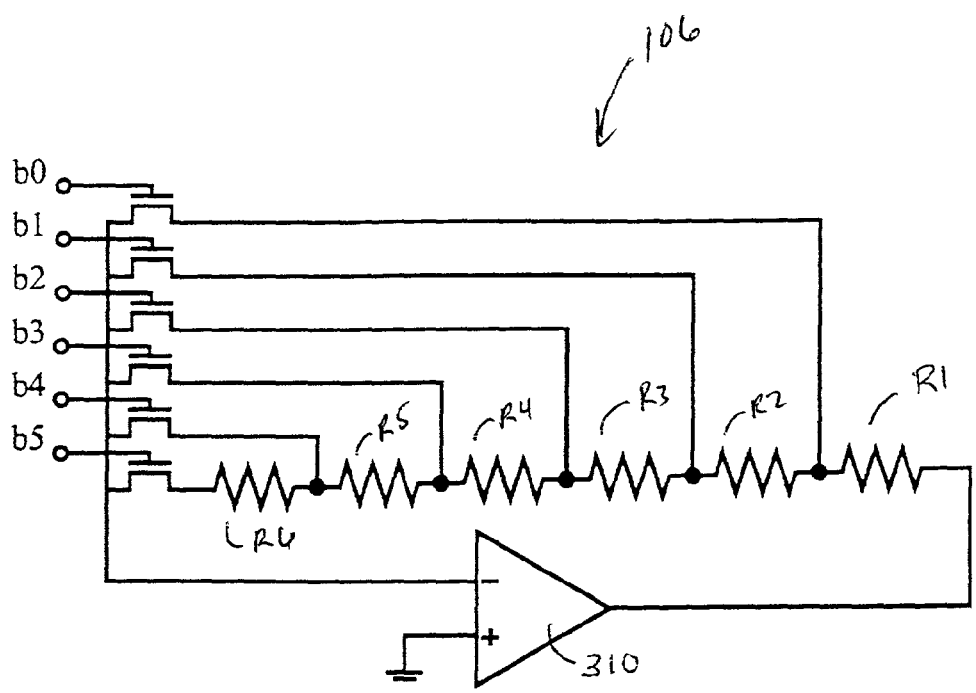
FIGURE 3. Trans-resistance Amplifier with Digitally-Controlled Resistor Network

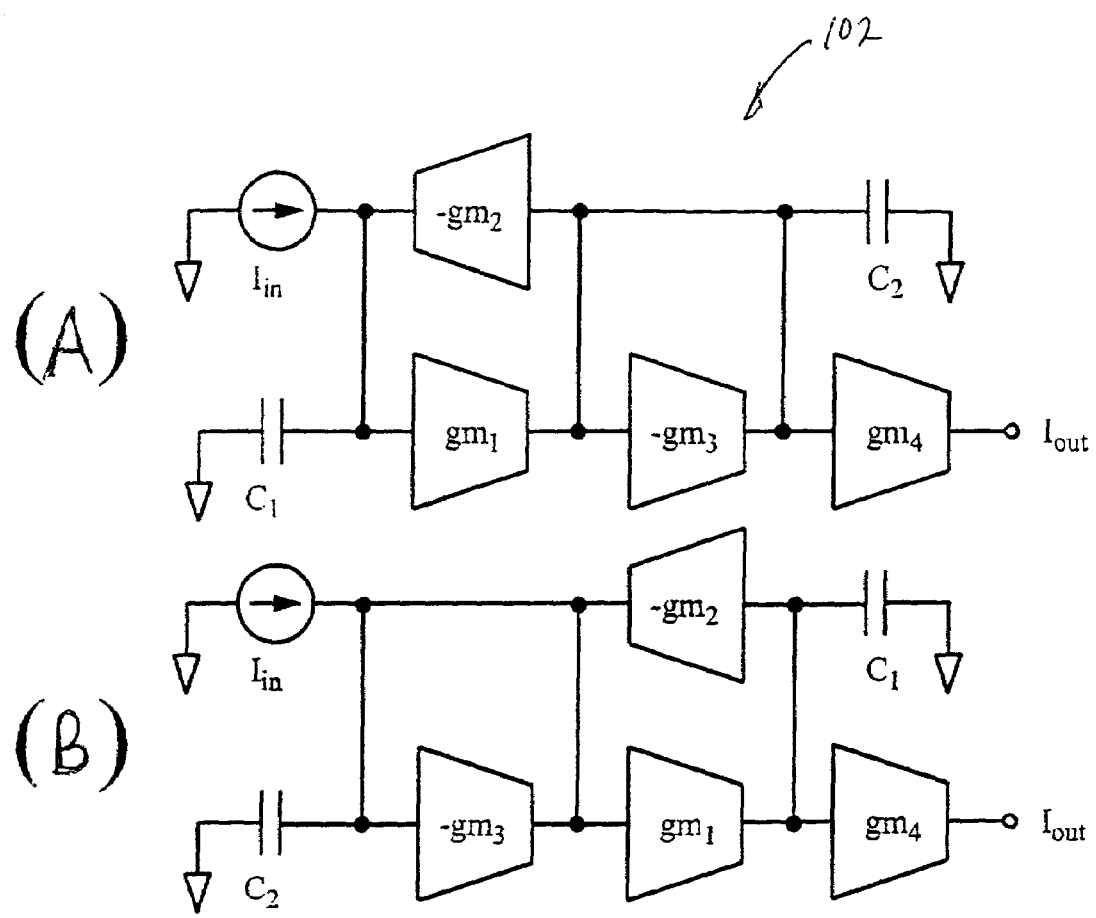
FIGURE 4. Two equivalent gm-C biquad topologies

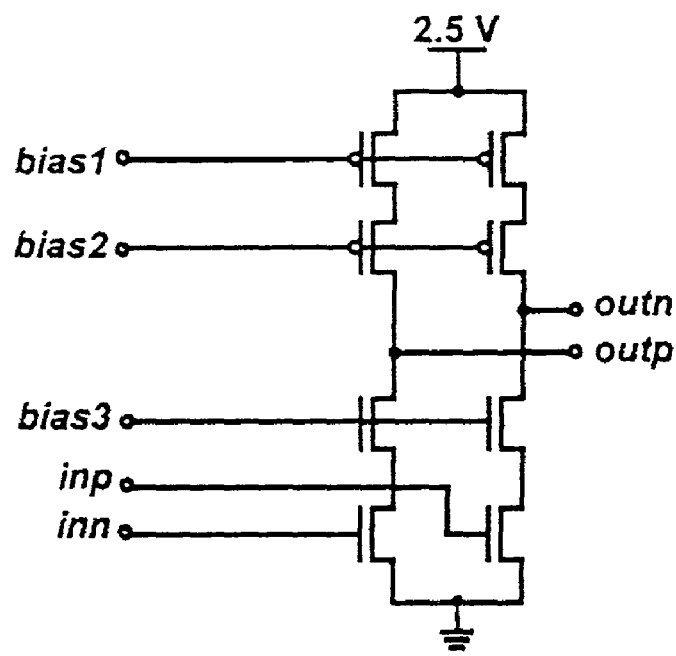
FIGURE 5. Transistor Implementation of Fixed-Gm Transconductors

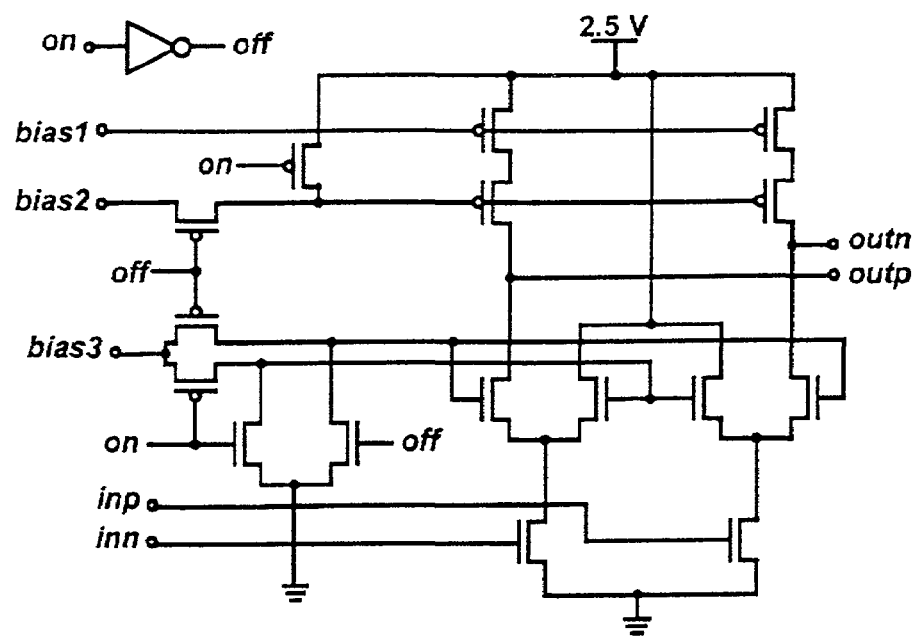
FIGURE 6. Transistor Implementation of Programmable-Gm Transconductor Unit Cell

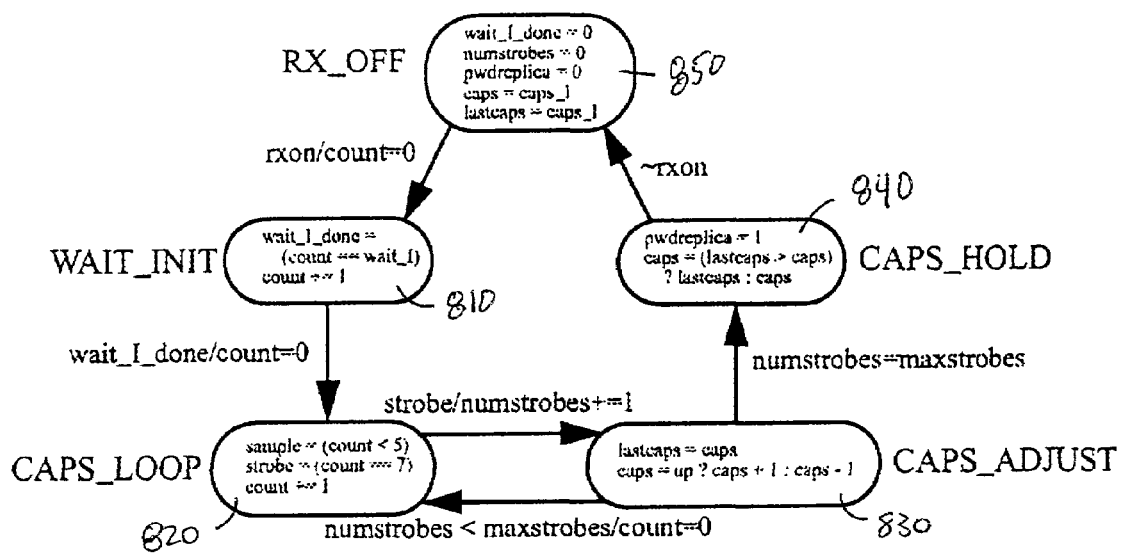
FIGURE 8. State Diagram of Capacitor Selection State Machine

INTEGRATED LOW POWER CHANNEL SELECT FILTER HAVING HIGH DYNAMIC RANGE AND BANDWIDTH

BACKGROUND OF THE INVENTION

1. Field of the Invention

The present invention relates generally to the field of electronic circuits, and more particularly to a programmable channel select filter having high dynamic range and bandwidth.

2. Description of the Related Art

With the increased ubiquity of wireless communication devices in offices and homes, one of the most difficult challenges continues to be the design of a cost-effective, power-efficient analog transceiver. Due to its compatibility with high levels of integration, CMOS process technology has proven to be a viable candidate for a low-cost radio solution. The choice of a radio architecture, however, is of critical importance in achieving a low-power, low-cost design.

Radio architectures that require no external filtering at IF emerge as the most likely choice for simultaneously meeting the constraints of power and cost. Because there is no filtering prior to the baseband portion of such a receiver, all contiguous channels get downconverted to baseband. For this reason, the baseband channel select filter must be able to handle a large dynamic range (i.e., 60 dB at the input to the filter to pass all IEEE 802.11a blocker specifications) at bandwidths on the order of 10 MHz. In an integrated implementation, the filter frequency response must be stable with respect to variations in temperature and the manufacturing process, an additional constraint which, when combined with the dynamic range and bandwidth requirements, makes the baseband channel select filter one of the most challenging blocks in the design of an integrated direct conversion receiver.

SUMMARY OF THE INVENTION

In general, the present invention is an integrated channel select filter, having high dynamic range and bandwidth, particularly suited for modem wireless device applications such as IEEE 802.11a/b/g, and other similar wireless protocols. In one embodiment, the present invention provides a filter comprising at least one transconductor-capacitor (gm-C) filter having an adjustable capacitance, a replica transconductor-capacitor (gm-C) filter having an adjustable capacitance similar to the at least one transconductor-capacitor (gm-C) filter, a clock device coupled to an input of the replica transconductor-capacitor (gm-C) filter, a phase detector coupled to an output of the replica transconductor-capacitor (gm-C) filter and configured to detect a phase shift in an output signal of the replica transconductor-capacitor (gm-C) filter, wherein an amount of phase shift detected by the phase detector is utilized to adjust the capacitance in the at least one transconductor-capacitor (gm-C) filter, and the replica transconductor-capacitor (gm-C) filter, in order to tune a cut-off frequency of the filter circuit.

The present invention may further include a transresistance amplifier having an adjustable resistance, connected to an output of at least one transconductor-capacitor (gm-C) filter. The operation of the filter circuit may be controlled by a state machine, connected to output a control signal to the at least one transconductor-capacitor (gm-C) filter and the replica transconductor-capacitor (gm-C) filter, in order to adjust the adjustable capacitance.

In another embodiment, the present invention may include at least one transconductor-capacitor (gm-C) filter having an adjustable capacitance and a programmable gain, a replica transconductor-capacitor (gm-C) filter having an adjustable capacitance similar to the at least one transconductor-capacitor (gm-C) filter, a transresistance amplifier, having an adjustable resistance, connected to an output of the at least one transconductor-capacitor (gm-C) filter, a clock device coupled to an input of the replica transconductor-capacitor (gm-C) filter, and a phase detector coupled to an output of the replica transconductor-capacitor (gm-C) filter and configured to detect a phase shift in a signal output by the replica transconductor-capacitor (gm-C) filter. An amount of phase shift detected by the phase detector is utilized to adjust the capacitance in the at least one transconductor-capacitor (gm-C) filter and the replica transconductor-capacitor (gm-C) filter, in order to tune a cut-off frequency of the filter circuit. Additionally, a gain is set by adjusting the programmable gain the at least one transconductor-capacitor (gm-C) filter and the adjustable resistance in the transresistance amplifier.

The present invention includes a method of filtering an input signal, the method comprising filtering the input signal with at least one transconductor-capacitor (gm-C) filter, wherein the operation of the at least one transconductor-capacitor (gm-C) is automatically controlled. The method of automatic control comprises inputting a clock signal into a replica transconductor-capacitor (gm-C) filter, detecting a phase shift in an output signal of the replica transconductor-capacitor (gm-C) filter, and adjusting a capacitance in the at least one transconductor-capacitor (gm-C) and the replica transconductor-capacitor (gm-C) filter, based upon the detected phase shift. The method may further include amplifying the output signal of the at least one transconductor-capacitor (gm-C) filter with a transresistance amplifier.

In one specific embodiment, the present invention includes a method of filtering an input signal, the method comprising filtering the input signal with a low Q biquad filter, filtering an output of the low Q biquad with a high Q biquad filter, and amplifying an output of the high Q biquad filter with a transresistance amplifier. The biquad filters are adjusted to automatically tune a cut-off frequency of the filter. The method of adjusting comprises inputting a clock signal into a replica biquad filter, detecting a phase shift in an output signal of the replica biquad filter, and adjusting a capacitance in the low Q biquad filter, the high Q biquad filter and the replica biquad filter, based upon the detected phase shift.

BRIEF DESCRIPTION OF THE DRAWINGS

The present invention will be readily understood by the following detailed description in conjunction with the accompanying drawings, wherein like reference numerals designate like structural elements, and in which:

FIG. 1 is a block diagram of a channel select filter according to an embodiment of the present invention;

FIG. 2 is a circuit diagram of a digitally controlled capacitor array according to an embodiment of the present invention;

FIG. 3 is a circuit diagram of a transresistance amplifier with a digitally controlled resistor network according to an embodiment of the present invention;

FIG. 4A is a circuit diagram of a gm-C biquad topology according to an embodiment of the present invention;

FIG. 4B is a circuit diagram of an alternate gm-C biquad topology according to an embodiment of the present invention;

FIG. 5 is a circuit diagram of a transistor based fixed-gm transconductor according to an embodiment of the present invention;

FIG. 6 is a circuit diagram of a transistor based programmable-gm transconductor unit cell according to an embodiment of the present invention;

FIG. 7A is a block circuit diagram of a replica tuning circuit according to an embodiment of the present invention;

FIG. 8 is a state diagram of a capacitor selection state machine according to an embodiment of the present invention.

DETAILED DESCRIPTION OF THE INVENTION

Figure 7B:
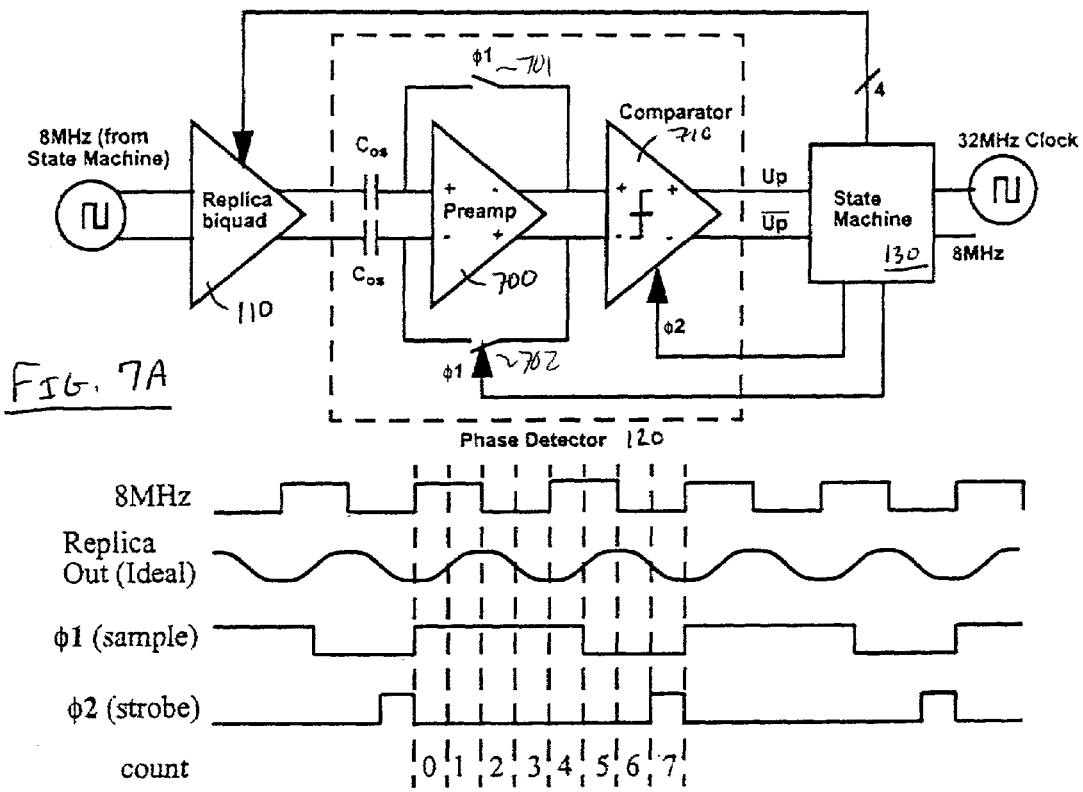
FIG. 7B is a timing diagram of the replica tuning circuit illustrated in FIG. 7A.

The following description is provided to enable any person skilled in the art to make and use the invention and sets forth the best modes contemplated by the inventor for carrying out the invention. Various modifications, however, will remain readily apparent to those skilled in the art. Any and all such modifications, equivalents and alternatives are intended to fall within the spirit and scope of the present invention.

In general, the present invention is an integrated channel select filter, having high dynamic range and bandwidth, particularly suited for modern wireless device applications such as IEEE 802.11a/b/g, and other similar wireless protocols. The present invention is especially suited to operate in a "turbo mode" system, in which data is transmitted at twice the speed of the normal 802.11a transmission. Consider, for example, a protocol having eight contiguous channels, which are each intended to be used by separate users. In turbo mode, two of the channels are utilized to communicate with a single user, thereby doubling the data rate. Thus, implementing a turbo mode under 802.11a protocol would increase the data rates from a standard 54 Mbits/sec to 108 Mbits/sec. The baseband bandwidth of such a turbo mode system is 17.5 MHz.

To address the issues of dynamic range and bandwidth in a channel select filter, provide tunability, and other improvements, the present invention utilizes a current-mode transconductor-capacitor (gm-C) architecture, tuned by means of digitally-controlled capacitor arrays. Referring to FIG. 1, a block diagram of a channel select filter 100 according to an embodiment of the present invention is illustrated. In this particular embodiment, the present invention is illustrated with two biquad filters in the main signal path, and a replica biquad filter. However, the present invention may be implemented utilizing one or more transconductor-capacitor (gm-C) filters, of which biquad filters are a subset, in the main signal path, and a transconductor-capacitor (gm-C) filter in the replica filter path, without departing from the scope of the present invention. Additionally, the present invention preferably incorporates a transresistance amplifier, but the teachings of the present invention are not limited to circuit configurations having a transresistance amplifier in the signal path.

In one particular embodiment, the filter 100 includes a three stage circuit arrangement comprising a low Q biquad filter 102, a high Q biquad filter 104, and a transresistance amplifier 106. A "biquad filter" is an electronic circuit that realizes a biqradratic transfer function, as is known in the art.

The low Q biquad 102 takes an input signal 101 and feeds the high Q biquad 104, which in turn feeds the transresistance amplifier 106. This provides a filtered output signal 107. The low Q and high Q biquads each take a current signal in, and output a current signal. The transresistance amplifier 106 takes in a current and outputs a voltage signal 107. Each of the biquads 102, 104 are digitally tuned. A separate replica biquad tuning circuit (control circuit), includes a clock signal 108, a replica biquad 110, a phase detector 120, and a state machine 130. The tuning circuit provides a binary value 132 that tunes each of the biquads 102, 104, 110 in order to implement a desired cut-off frequency of the filter 100. More particularly, the state machine 130 provides a digital signal 132 that selects a capacitor setting of a capacitor array in the biquads, which tunes the filter accordingly.

The digital signal 132 from the state machine is based upon the output of the replica biquad 110 and phase detector 120. In order to save power and die area, the replica biquad 100 is a scaled down version of the high Q biquad 104. The replica biquad 110 is tuned to have a −3 dB cut-off frequency of 8 MHz. One of the characteristics of a biquad circuit is that when it is driven at its cut off frequency, it has exactly 90 degrees of phase shift between its input and its output. Thus, if the phase shift of the replica biquad 110 is detected, and forced to be 90° by using a feedback control scheme, the biquad filter will be at its cut-off frequency. If the same feedback input is used to drive the actual signal path filters (i.e., the high and low Q biquads), then their frequency responses are adjusted in accordance with the adjustment applied to the replica biquad 110. In further detail, the phase detector 120 detects the 90° phase shift, or any variance from the 90° phase shift, and provides the result to the state machine 130. The state machine 130 then drives the other stages (102 and 104) along with the replica biquad 110, until the phase shift is exactly 90°.

For example, to obtain a preset cut-off frequency, an 8 MHz signal 108 is fed into the replica biquad 110. The initial cut-off frequency will generally not be correct (i.e. the phase shift is either too high or too low). The phase detector 120 detects the non-90° condition, and outputs a correction signal to the state machine 130. The state machine 130 updates the settings in the replica biquad 110 in order to obtain the preset cut-off frequency. Once the cut-off frequency is established, the state machine 130 inputs the same information that tuned the replica biquad into the main filter stages (102 and 104). Thus, this process automatically sets the cut-off frequency of the main filter, based upon the operating condition of the replica biquad 110.

FIG. 2 is a circuit diagram of a digitally controlled capacitor array 200 according to an embodiment of the present invention. The capacitor array 200 is fitted at the nodes of each of the low and high Q biquads 102, 104 and at the replica biquad 110. The capacitor array 200 is used to tune each of the biquads in parallel using the same digital input values. The capacitor array 200 includes a series of capacitive cells between the out+ and out− terminals of the capacitor array 200. Each unit cell 230 has an amount of capacitance that is applied between the out+ and out− terminals based on a digital input. Each cell has one or more switches that connect the cell capacitance between the out+ and out− terminals. For example cell $b_0$, 230 has a capacitance $C_0$ that is applied between out+ and out− when a voltage is applied to terminal $b_0$. The next cell has a $2C_0$ capacitance value that is applied between out+ and out− when a voltage is applied to terminal b1. Each cell has twice the capacitance of a previous cell, resulting in a series of digital inputs that define an amount of capacitance that is then applied to the biquad filters. Note that all the circuits described herein are fully differential, and thus the capacitor array 200 is illustrated as a differential array.

The filter transfer function of the channel select filter 100 is a fourth-order Butterworth lowpass, with a −3 dB cut-off frequency which is selectable to either 11 MHz (in standard mode) or 22 MHz (in turbo mode). The four filter poles are constructed by cascading two biquad (two-pole) filter sections. Each biquad section contains 18 dB of programmable gain in 6 dB steps which, when combined with a third current-to-voltage conversion stage 106 having 5 dB of programmable gain in 1 dB steps, results in 41 dB of total baseband programmable gain range in 1 dB steps. Specifically, the minimum gain is 1 kΩ (since the input to the filter is a current, and the output a voltage), and the maximum gain is 1 kΩ+41 dB=112.2 kΩ. The units of the transresistance amplifier gain is in units of Ohms, rather than dB, because the gain is actually the value of the feedback resistor. The value of the resistor is converted to dB using the 20 log function used for converting to dB.

The programmable gain in the biquad stages is implemented through digitally switched current mirrors (FIG. 6), whereas the current-to-voltage stage consists of an op amp transresistance stage with a digitally-controlled resistor network, of which a single-ended version is shown in FIG. 3.

FIG. 3 is a circuit diagram of a transresistance amplifier 106 with a digitally controlled resistor network according to an embodiment of the present invention. An operational amplifier (op-amp) 310 has a series of feedback resistors R1 . . . R6. Each resistor has a corresponding switch that is set by application of a voltage to a corresponding terminal ($b_0$ . . . b5). Thus, different sets of resistors can be shorted-out to change the properties of the transresistance amplifier 106. With proper sizing of the resistors, the gain can be adjusted in 1 dB increments.

FIG. 4A is a circuit diagram of a first gm-C biquad topology according to an embodiment of the present invention. FIG. 4B is a circuit diagram of a second gm-C biquad topology according to an alternative embodiment of the present invention. Functionally, the two circuits are equivalent. A set of gm stages (gm1, gm2, gm3, and gm4), are shown as trapezoidal blocks. Each gm stage is a circuit block which has an input voltage applied to the longer side of the trapezoid, and a current output on the shorter side. For example, on the gm1 block, a voltage is applied to the left side of the block and a current is output on the right side of the block. The output of the block is equal to the gain coefficient of the gm stage (gm1), multiplied by the input voltage or:

$$Iout1 = gm1 \times Vgm1$$

The next stage, gm3, is negative (i.e. −gm3) and also the input and output terminals of the block are effectively directly connected. If the voltage is increased (on the left side), the current is pulled down, thus acting like a resistor. The difference is that the effective resistance would be the inverse of gm because gm is in units inverse to resistance (i.e. 1/Ω).

Each of the biquad implementations illustrated in FIG. 4 has four gm blocks and two capacitors (C1 and C2). The transfer function of either circuit is shown below. These equations then reduce to specific parts, such as a gain and a cut-off frequency.

The transfer function of either circuit is:

$$H(s) = \frac{I_{out}(s)}{I_{in}(s)} = \frac{gm_4}{gm_2}\left(\frac{1}{1 + \frac{sC_1 gm_3}{gm_1 gm_2} + \frac{s^2 C_1 C_2}{gm_1 gm_2}}\right) \quad (EQ\ 1)$$

From this equation, the three independent biquad parameters of DC gain, −3 dB cutoff frequency $\omega_c$, and quality factor Q can be inferred:

$$DC\ gain = H(0) = \frac{gm_4}{gm_2} \quad (EQ\ 2)$$

$$\omega_c = \sqrt{\frac{gm_1 gm_2}{C_1 C_2}} \quad (EQ\ 3)$$

$$Q = \frac{\sqrt{gm_1 gm_2}}{gm_3}\sqrt{\frac{C_2}{C_1}} \quad (EQ\ 4)$$

To achieve programmable DC gain the present implementation adjusts gm4 since gm4 is the only parameter which controls gain without affecting either the cutoff frequency or Q. Note that gm4 is absent in both EQ 3 and EQ 4, above. The capacitors C1 and C2 are implemented as binary weighted capacitor arrays in parallel, similar to that illustrated in FIG. 2. A digital code output by the state machine 130 is sent to terminals $b_0$ . . . $b_4$ to set a specific capacitance value.

The fixed-gm transconductors (gm1, gm2, gm3) may be implemented as illustrated by the transistor level diagram of FIG. 5. The programmable gm-transconductance block (gm4) may be implemented as a parallel connection of eight unit cells, one of which is shown in FIG. 6.

The gain setting of gm4 is dictated by how many of the eight unit cells are "on". The four possible settings are 1, 2, 4 or 8, corresponding to 0 dB, 6 dB, 12 dB and 18 dB of gain, relative to the transconductance of a single unit cell. Note that, as illustrated in FIG. 6, when a transconductor unit cell is "off", the NMOS currents are switched to the positive power supply rail, rather than shut off. Applying the same DC bias in all of the NMOS transistors in each unit cell ensures that the parasitic capacitance contributed by the input of $gm_4$ remains independent of the gain setting.

The choice between the two biquad topologies described above is determined by considering signal scaling at the internal node. In order to maximize the dynamic range, the signal power at all four signal nodes of the filter should be kept within reasonable limits. Preferably, the present invention uses the topology of FIG. 4(A) for the first, low Q biquad 102, and the topology of FIG. 4(B) for the second, high Q biquad 104. From standard filter theory, in order to achieve a four-pole Butterworth response, the Q of these two biquads is 0.541 and 1.307, respectively.

One advantage of the present current-mode topology is that linearity is preserved even in the presence of a nonlinear transconductor. Individually, the transconductors do not have particularly linear voltage-to-current characteristics. However, in the context of a current-in/current-out topology, the nonlinearity of the first current-to-voltage conversion is compensated by the non-linearity of the corresponding voltage-to-current conversion. More precisely, the current-mode biquad filter acts like a cascoded current mirror in the passband, and cascoded current mirrors have very good linearity.

FIG. 7A is a block diagram of a replica biquad tuning circuit according to an embodiment of the present invention. The replica tuning circuit includes the replica biquad filter 110, the phase detector 120, and the state machine 130. The phase detector 120 is shown in greater detail and includes a pre-amplifier 700, a comparator 710, an input capacitor pair $C_{OS}$, and a pair of phase signals φ1 and φ2. The pre-amplifier 700 has AC coupling on its input. Two switches 701, 702 are connected across the pre-amplifier 700, and are controlled by the phase signal φ1, which is generated by the state machine 130. The polarity of the pre-amplifier 700 is illustrated in FIG. 7(A). The negative output is connected to the positive input via one switch 701, and the positive output is connected to the negative input via the other switch 702.

FIG. 7B is a timing diagram of the replica tuning circuit illustrated in FIG. 7A. The first signal represents an 8 MHz clock, which is preferably implemented as a square wave with 50% duty cycle, and serves as the input to the replica biquad filter. The second signal represents the output of the replica filter when its phase shift is exactly 90 degrees at 8 MHz. Note that the output is not only phase-shifted, but the harmonics of the square wave are filtered as well, resulting in a more sinusoidal waveform. The third signal represents the offset sampling phase; specifically, switches 701 and 702 are closed when the φ1 waveform is high, and open when the φ1 waveform is low. Finally, the fourth signal represents the comparator strobe phase; specifically, the comparator is strobed on the rising edge of φ2. The numbers 0 through 7 and labeled 'count' refer to the 'count' variable in the state diagram (FIG. 8). These count increments are identified in the timing diagram in order to explain the operation of the state diagram in FIG. 8.

The switched-capacitor pre-amplifier of the phase detector 120 serves two functions: (1) it provides about 12 dB of gain to overcome the DC offset of the comparator; and (2) switched-capacitor operation cancels the DC offset present at the output of the replica biquad, plus a portion of the input-referred offset of the comparator itself. To understand this DC-offset cancellation scheme more clearly, consider the operation of the phase detector when the replica biquad output contains a DC offset. First, note that the input and output of the replica biquad can be expressed:

$$V_{in}(replica) = \cos(2\pi f t) \quad (EQ\ 5)$$

$$V_{out}(replica) = \cos\left(2\pi f t - \frac{\pi}{2} - \phi\right) + V_{DC}$$
$$= \sin(2\pi f t - \phi) + V_{DC}$$

where the signal sizes at input and output are normalized to unit amplitude, f is the reference frequency (8 MHz), φ is the phase deviation from an ideal 90° (π/2) and $V_{DC}$ is the DC offset. During the sample phase φ1, the pre-amplifier inputs and outputs are shorted together and the voltage on the offset storage capacitors $C_{os}$ track the output of the replica biquad. If the falling edge of φ1 is assigned to time t=0, then the voltage stored on the capacitors at t=0 (when the sampling switches are opened) is:

$$V(C_{os}) = \sin(-\phi) + V_{DC} \quad (EQ\ 6)$$

Subsequently, the input to the pre-amplifier will equal the replica output minus $V(C_{OS})$, or $$V_{in}(preamp) = \sin(2\pi f t - \phi) + V_{DC} - (\sin(-\phi) + V_{DC}) \quad (EQ\ 7)$$
$$= \sin(2\pi f t - \phi) + \sin(\phi)$$

from which it can be seen that the DC offset is effectively cancelled. Finally, at the rising edge of the compare phase φ2, the signal has advanced 180 degrees, so the pre-amplifier input at the instant of strobing the comparator is:

$$V_{in}(preamp) = \sin(\pi - \phi) + \sin(\phi) \quad (EQ\ 8)$$
$$= 2\sin(\phi)$$

Note that this technique not only cancels the DC offset, but yields an additional gain of 2 in front of the preamp, which offers further immunity to comparator offsets. Circuit simulations indicate that without this DC offset cancellation approach, the accumulated DC offsets in the circuit are enough to cause at least 1 LSB of uncertainty in the capacitor setting. The DC offset cancellation approach described above solves this problem. In summary, as illustrated in the circuit and timing diagrams, the entire process makes the comparator sensitive to the phase difference from 90°, without being sensitive to the DC offset.

The state machine 130 is clocked at 32 MHz, and generates the 8 MHz replica biquad filter input square wave, as well as the clock phases φ1 (the sample phase) and φ2 (the compare phase). Note that all of the transitions of the 8 MHz clock and of both the sample and compare phases occur on rising edges of the 32 MHz clock (the first eight of these rising edges are drawn as dotted lines in the figure); this alignment facilitates design of the logic in the state machine, since positive-edge-triggered synchronous logic can generate these three clocks with very good phase accuracy.

FIG. 8 is a state diagram of a capacitor selection state machine 130 according to an embodiment of the present invention. Each state illustrated includes pseudo code, which is an example programming structure for implementing each of the illustrated states. As an example programming structure, the pseudo code for each state is not intended to be a compilable or executable portion of code, but as an example programming structure that provides a non-limiting implementation of a process or method consistent with the present invention.

Preferably, the present invention is implemented in a packet based system such as an 802.11a/b/g system. If a system is packet-based, it receives packets periodically, which tend to be on the order of 1 ms long. The receiver is turned on and off with each received packet, and therefore the receiver is turned on with a certain frequency. The present invention tunes the capacitors each time the receiver is turned "on." Once the filter calibration procedure converges, it holds the correct capacitor settings to tune the filter to the selected cut-off frequency. The held settings are correct, accounting for thermal drift or other variances, for at least one millisecond.

When the receiver is restarted, the filter determines the right settings by determining when there is a transition from a series of "up" requests to a "down" request, or vice versa. That is, if there are a series of up adjustments, and then a down, the filter must be on the transition point between up and down, and it picks the higher state. This type of selection makes the calibration more repeatable. The starting point for the next calibration cycle is just above the same position of the last calibration.

Thus, the calibration can be performed once every millisecond. The actual timing of the calibrations, however, may be highly dependent on what kind of traffic the network is experiencing. In a typical case, a packet is about 1 ms long and the frequency that the packets are being received is unimportant, since the filter does this calibration at the beginning of each received packet (e.g., each request to receive), and the filter maintains that calibration for the duration of the receive packet.

The behavior of the state machine can be summarized as follows. The state machine begins operation immediately after the receiver is turned on. At this point, the state machine waits a programmable duration period wait I 810 in order for the power-on transients to settle. Next, the state machine enters a loop 820/830 in which it performs the offset-sampling and phase comparison operation described with respect to the timing diagram of FIG. 7B. At each comparator decision, the state machine adjusts the capacitor settings, either incrementing the capacitance if the phase is less than 90°, or decrementing it if the phase is greater than 90°. The state machine produces a programmable number of comparator strobes (maxstrobes). At this point, it is assumed that the point of 90° phase shift has been found, and the comparator is oscillating between its two possible states. The state machine then picks the higher of the two capacitor settings which straddle the transition between up and down, then shuts down the replica filter circuit 840, and holds the final capacitor setting for the duration of the receive packet 850. The time duration occupied by the capacitor selection is programmable through the parameter maxstrobes. With a careful selection of parameters, the algorithm occupies a maximum of 2 μsec, and typically takes less than 0.5 μsec. In either case, the calibration procedure converges to a final capacitance setting before data is expected to be received. Furthermore, since a typical receive packet is on the order of 1 ms long, the average power dissipation of the replica tuning circuit is effectively zero.

As described herein, the baseband filter architecture of the present invention contains several innovations over previous implementations. Compared to an off-chip passive filter, the integrated approach possesses four distinct advantages: (1) cost advantages associated with the high level of integration; (2) with careful chip layout, the on-chip components can be expected to match each other better than off-chip components, resulting in better I-Q amplitude and phase matching performance; (3) better cut-off frequency control; and (4) routing signals off-chip is an inconvenience due to increased pin count (for instance, previous passive filter implementations require 12 or more additional I/O pins) and the associated degradation of signal integrity. The tuning system chosen for this design possesses several advantages over previous implementations of integrated filters. Compared to continuous-time tuned filters (for example, PLL-based), in the interval while signals are being received the digital capacitor selection approach does not perturb the signal path; in fact, it does not even dissipate any power. Compared to approaches which tune the gm's in a gm-C filter, the capacitor-tuning approach does not suffer changes in linearity performance across the tuning range.

The present invention is preferably implemented in a direct conversion receiver, however, the processes and technologies discussed herein may be applied to other receiver types. In describing preferred embodiments of the present invention illustrated in the drawings, specific terminology is employed for the sake of clarity. However, the present invention is not intended to be limited to the specific terminology so selected, and it is to be understood that each specific element includes all technical equivalents which operate in a similar manner. For example, when describing a digitally controlled capacitor array, any other equivalent device, such as a analog or other variable capacitor, or other device having an equivalent function or capability, whether or not listed herein, may be substituted therewith. Furthermore, the inventors recognize that newly developed technologies not now known may also be substituted for the described parts and still not depart from the scope of the present invention. All other described items, including, but not limited to transconductance blocks (gms), op-amps, state machines, clocks, transistors and other electrical components, etc should also be consider in light of any and all available equivalents.

Portions of the present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art based on the present disclosure.

Included in the programming (software) of the general/ specialized computer or microprocessor are software modules for implementing the teachings of the present invention, including, but not limited to, recognizing packet receptions, tuning capacitors and other electrical components, recognizing phase shifts, etc.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A filter circuit in a packet communications system comprising:
    at least one transconductor-capacitor (gm-C) filter having an adjustable capacitance;
    a replica transconductor-capacitor (gm-C) filter having an adjustable capacitance similar to the at least one transconductor-capacitor (gm-C) filter;
    a clock device coupled to an input of the replica transconductor-capacitor (gm-C) filter;
    a phase detector coupled to an output of the replica transconductor-capacitor (gm-C) filter and configured to detect a phase shift in a signal output by the replica transconductor-capacitor (gm-C) filter;
    wherein an amount of phase shift detected by the phase detector is utilized to adjust the capacitance in the at least one transconductor-capacitor (gm-C) filter and the replica transconductor-capacitor (gm-C) filter, in order to tune a cut-off frequency of the filter circuit; and
    the filter circuit further comprises a hold circuit configured to hold the adjusted capacitance in the at least one transconductor-capacitor (gm-C) filter for only a duration of a packet being received, and then readjusts the at least one transconductor-capacitor (gm-C) filter upon receipt of a next packet.

2. The filter circuit of claim 1, further comprising a transresistance amplifier connected to an output of the at least one transconductor-capacitor (gm-C) filter.

3. The filter circuit of claim 2, further comprising:
a state machine coupled to an output of the phase detector and configured to set the capacitance in the at least one transconductor-capacitor (gm-C) filter and the replica transconductor-capacitor (gm-C) filter.

4. The filter circuit of claim 3, wherein the state machine produces a digital signal used to set a digitally controlled capacitive element in the at least one transconductor-capacitor (gm-C) filter and the replica transconductor capacitor (gm-C) filter.

5. The filter circuit of claim 1, wherein the at least one transconductor-capacitor (gm-C) filter comprises a low Q biquad filter and a high Q biquad filter configured in series.

6. The filter circuit of claim 5, wherein the replica transconductor-capacitor (gm-C) is a scaled version of the high Q biquad filter.

7. The filter circuit of claim 6, wherein each of the low Q biquad, high Q biquad, and replica biquad are adjusted by a digitally tuned capacitor array.

8. The filter according to claim 7, wherein the digitally controlled capacitor array comprises:
a +terminal and a −terminal;
a set of capacitor cells coupled between the +terminal and the −terminal, each capacitor cell having,
a first capacitor, one side of the first capacitor coupled to the +terminal and an opposite side of the first capacitor coupled to the −terminal;
a switch coupled between the first capacitor and one of the +terminal and −terminal; and
a cell terminal coupled to the switch and configured to apply a voltage that controls an open and closed status of the switch.

9. The filter circuit of claim 8, wherein the capacitor cells have a binary coded amount of capacitance in a form of $KC_0$, where K is an integer from 0 to $2^{n-1}$, inclusive.

10. The filter circuit of claim 9, wherein the low Q biquad filter, the high Q biquad filter, and the replica biquad filter each comprise a plurality of fixed-gm transconductors and at least one programmable-gm transconductor.

11. The filter circuit of claim 6, wherein the transresistance amplifier resistance is adjusted by a digitally tuned feedback resistor.

12. A filter circuit, comprising:
at least one transconductor-capacitor (gm-C) filter having an adjustable capacitance;
a replica transconductor-capacitor (gm-C) filter having an adjustable capacitance similar to the at least one transconductor-capacitor (gm-C) filter;
a clock device coupled to an input of the replica transconductor-capacitor (gm-C) filter;
a phase detector coupled to an output of the replica transconductor-capacitor (gm-C) filter and configured to detect a phase shift in a signal output by the replica transconductor-capacitor (gm-C) filter;
a transresistance amplifier connected to an output of the at least one transconductor-capacitor (gm-C) filter; and
a state machine coupled to an output of the phase detector and configured to set the capacitance in the at least one transconductor-capacitor (gm-C) filter and the replica transconductor-capacitor (gm-C) filter;

wherein:
an amount of phase shift detected by the phase detector is utilized to adjust the capacitance in the at least one transconductor-capacitor (gm-C) filter and the replica transconductor-capacitor (gm-C) filter, in order to tune a cut-off frequency of the filter circuit; and
the phase detector comprises:
a preamplifier having a positive input terminal, a negative input terminal, a positive output terminal and a negative output terminal;
a comparator coupled between the preamplifier and the state machine;
a first capacitor coupled to the positive input terminal;
a second capacitor coupled to the negative input terminal;
a first switch coupled between the positive input terminal and the negative output terminal; and
a second switch coupled between the negative input terminal and the positive output terminal.

13. The filter circuit of claim 12, wherein the first and second switches are controlled by a first phase signal output by the state machine, and the comparator is controlled by a second phase signal output by the state machine.

14. A filter circuit comprising:
at least one transconductor-capacitor (gm-C) filter having an adjustable capacitance and a programmable gain;
a replica transconductor-capacitor (gm-C) filter having an adjustable capacitance similar to the at least one transconductor-capacitor (gm-C) filter;
a transresistance amplifier, having an adjustable resistance, connected to an output of the at least one transconductor-capacitor (gm-C) filter;
a clock device coupled to an input of the replica transconductor-capacitor (gm-C) filter;
a phase detector coupled to an output of the replica transconductor-capacitor (gm-C) filter and configured to detect a phase shift in a signal output by the replica transconductor-capacitor (gm-C) filter;
wherein an amount of phase shift detected by the phase detector is utilized to adjust the capacitance in the at least one transconductor-capacitor (gm-C) filter and the replica transconductor-capacitor (gm-C) filter, in order to tune a cut-off frequency of the filter circuit;
wherein a gain is set by adjusting the programmable gain in the at least one transconductor-capacitor (gm-C) filter and the adjustable resistance in the transresistance amplifier; and
wherein the filter circuit further comprises a hold circuit configured to hold the adjusted capacitor for a duration of a receive packet.

15. The filter circuit of claim 14, wherein the at least one transconductor-capacitor (gm-C) filter comprises two transconductor-capacitor (gm-C) filters, each having at least one programmable-gm transconductor.

16. A radio receiver having an integrated channel select filter, the channel select filter comprising:
a low Q biquad filter having a digitally tuned capacitor array;
a high Q biquad filter having a digitally tuned capacitor array, coupled to an output of the low Q biquad filter;
a replica biquad filter having a digitally tuned capacitor array, the replica biquad filter comprising a scaled version of the high Q biquad filter;
a transresistance amplifier having a digitally tuned feedback resistor, connected to an output of the high Q biquad filter;
a clock device coupled to an input of the replica biquad filter;

a phase detector coupled to an output of the replica biquad filter and configured to detect a phase shift in a signal output by the replica biquad filter; and a state machine coupled to an output of the phase detector and configured to output a digital signal to adjust the capacitor arrays in the low Q biquad filter, the high Q biquad filter, and the replica biquad filter, in order to tune a cut-off frequency of the channel select filter;

wherein the state machine includes a hold state in which the capacitor arrays are not re-adjusted until after a remaining duration of a packet being received by the radio receiver.

17. A radio receiver having an integrated channel select filter, the channel select filter comprising:

a low Q biquad filter having a digitally tuned capacitor array;

a high Q biquad filter having a digitally tuned capacitor array, coupled to an output of the low Q biquad filter;

a replica biquad filter having a digitally tuned capacitor array, the replica biquad filter comprising a scaled version of the high Q biquad filter;

a transresistance amplifier having a digitally tuned feedback resistor, connected to an output of the high Q biquad filter;

a clock device coupled to an input of the replica biquad filter;

a phase detector coupled to an output of the replica biquad filter and configured to detect a phase shift in a signal output by the replica biquad filter; and a state machine coupled to an output of the phase detector and configured to output a digital signal to adjust the capacitor arrays in the low Q biquad filter, the high Q biquad filter, and the replica biquad filter, in order to tune a cut-off frequency of the channel select filter;

wherein the phase detector comprises:

a preamplifier having a positive input terminal, a negative input terminal, a positive output terminal and a negative output terminal;

a comparator coupled between the preamplifier and the state machine;

a first capacitor coupled to the positive input terminal;

a second capacitor coupled to the negative input terminal;

a first switch coupled between the positive input terminal and the negative output terminal; and a second switch coupled between the negative input terminal and the positive output terminal.

18. The radio receiver of claim 17, wherein the first and second switches are controlled by a first phase signal output by the state machine, and the comparator is controlled by a second phase signal output by the state machine.

19. A method of filtering an input signal, the method comprising:

filiering the input signal with at least one transconductor-capacitor (gm-C) filter, wherein the at least one transconductor-capacitor (gm-C) filter is adjusted to automatically tune a cut-off frequency, the method of adjusting comprising:

inputting a clock signal into a replica transconductor-capacitor (gm-C) filter;

detecting a phase shift in an output signal of the replica transconductor-capacitor (gm-C) filter;

adjusting a capacitance in the at least one transconductor-capacitor (gm-C) and the replica transconductor-capacitor (gm-C) filter, based upon the detected phase shift; and holding the adjusted capacitance until a packet in a communication device has been received and then repeating the step of adjusting for a next packet.

20. The method of claim 19, further comprising amplifying the output signal of the at least one transconductor-capacitor (gm-C) filter with a transresistance amplifier.

21. A method of filtering an input signal, the method comprising:

filtering the input signal with a low Q biquad filter;

filtering an output of the low Q biquad with a high Q biquad filter; and amplifying an output of the high Q biquad filter with a transresistance amplifier;

wherein the biquad filters are adjusted to automatically tune a cut-off frequency, the method of adjusting comprising:

inputting a clock signal into a replica biquad filter;

detecting a phase shift in an output signal of the replica biquad filter;

adjusting a capacitance in the low Q biquad filter, the high Q biquad filter and the replica biquad filter, based upon the detected phase shift at a beginning of each packet received in a communication device.

22. A filter circuit in a packet communications system comprising:

a transconductor-capacitor (gm-C) filter having an adjustable capacitance;

a replica transconductor-capacitor (gm-C) filter having an adjustable capacitance similar to the transconductor-capacitor (gm-C) filter;

a clock device coupled to the replica transconductor-capacitor (gm-C) filter; and a phase detector coupled to the replica transconductor-capacitor (gm-C) filter that detects phase shift of a signal output by the replica transconductorcapacitor (gm-C) filter;

wherein:

at the beginning of each packet received, an amount of phase shift detected by the phase detector is utilized to adjust the capacitance in the at least one transconductor-capacitor (gm-C) filter and the replica transconductor-capacitor (gm-C) filter, in order to tune a cut-off frequency of the filter circuit.

23. The filter circuit according to claim 22, further comprising a hold state during which the capacitance of the adjusted capacitor filter is until re-adjustment after receipt of a current packet being received.

24. A filter device in a packet communications system comprising:

a capacitor filter having an adjustable capacitance;

a replica capacitor filter having an adjustable capacitance similar to the capacitor filter;

a clock device coupled to the replica capacitor filter; and a phase detector coupled to the replica capacitor filter that detects phase shift of a signal output by the replica capacitor filter;

wherein at the beginning of each of packets received, an amount of phase shift detected by the phase detector is utilized to adjust capacitance in the capacitor filter and the replica capacitor filter to an amount used to tune the filter device and the adjusted capacitance of the capacitor filter is held for a remainder of receipt of each packet after adjustment.

* * * * *